US010838369B2

(12) United States Patent
Hong et al.

(10) Patent No.: US 10,838,369 B2
(45) Date of Patent: Nov. 17, 2020

(54) PHYSICS MODULE OF CHIP-SCALE ATOMIC CLOCK (71) Applicant: KOREA RESEARCH INSTITUTE OF STANDARDS AND SCIENCE, Daejeon (KR)

(72) Inventors: Hyun Gue Hong, Seoul (KR); Taeg Yong Kwon, Daejeon (KR); Sang Eon Park, Daejeon (KR); Sang Bum Lee, Daejeon (KR); Myoung Sun Heo, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 16/475,210

(22) PCT Filed: Jan. 10, 2017

(86) PCT No.: PCT/KR2017/000339
§ 371 (c)(1),
(2) Date: Jul. 1, 2019

(87) PCT Pub. No.: WO2018/124361
PCT Pub. Date: Jul. 5, 2018

(65) Prior Publication Data
US 2019/0346815 A1 Nov. 14, 2019

(30) Foreign Application Priority Data
Jan. 2, 2017 (KR) .................. 10-2017-0000424

(51) Int. Cl.
G04F 5/14 (2006.01)
H01S 3/00 (2006.01)
(Continued)

(52) U.S. Cl.
CPC ............... *G04F 5/145* (2013.01); *G02B 5/30* (2013.01); *G04F 5/14* (2013.01); *H01S 3/0007* (2013.01); *H03L 7/26* (2013.01)

(58) Field of Classification Search
CPC ... H03L 7/26; G04F 5/145; G04F 5/14; H03B 17/00
See application file for complete search history.

(56) References Cited

U.S. PATENT DOCUMENTS 6,265,945 B1 7/2001 Delaney et al.
8,242,851 B2 8/2012 Youngner et al.
(Continued)

FOREIGN PATENT DOCUMENTS

CN 103955129 A 7/2014
CN 105467821 A 4/2016
(Continued)

OTHER PUBLICATIONS

Bozhong Tan, etal., "Noise suppression in coherent population-trapping atomic clock by differential magneto-optic rotation detection", Optics Letters, vol. 40, No. 16, Aug. 15, 2015.
(Continued)

Primary Examiner — Ryan Johnson
(74) Attorney, Agent, or Firm — Harness, Dickey & Pierce, P.L.C.

(57) ABSTRACT

An embodiment of the inventive concept provides a physics module of a chip-scale atomic clock. The physics module includes: a housing; a laser source disposed in the housing and generating a laser beam; a vapor cell disposed above the laser source to generate a transmitted beam from the laser beam; and a detector disposed above the vapor cell to detect the transmitted beam. Here, the vapor cell may include a plurality of optical patterns configured to polarize the laser beam.

14 Claims, 5 Drawing Sheets (51) Int. Cl.
*H03L 7/26* (2006.01)
*G02B 5/30* (2006.01)

(56) References Cited

U.S. PATENT DOCUMENTS

| | | | |
|---|---|---|---|
| 2006/0022761 A1 | 2/2006 | Abeles et al. | |
| 2007/0146085 A1 | 6/2007 | Koyama | |
| 2009/0066430 A1 | 3/2009 | Braun et al. | |
| 2013/0043956 A1 | 2/2013 | Salit et al. | |
| 2015/0277386 A1 | 10/2015 | Passilly et al. | |
| 2016/0022761 A1 | 1/2016 | Wagner et al. | |
| 2016/0025914 A1 | 1/2016 | Brongersma et al. | |
| 2017/0288688 A1* | 10/2017 | Maki | H03L 7/26 |

FOREIGN PATENT DOCUMENTS

| | | |
|---|---|---|
| JP | 2011-237401 A | 11/2011 |
| KR | 10-2002-0044311 A | 6/2002 |
| KR | 10-2007-0079478 A | 6/2007 |
| KR | 10-2007-0079478 A | 8/2007 |
| WO | WO-2016/044104 A1 | 3/2016 |
| WO | WO 2016/044104 A1 | 3/2016 |

OTHER PUBLICATIONS

Dianmin Lin, et al., "Dielectric gradient metasurface optical elements", Science, vol. 342, Issue 6194, Jul. 18, 2014.
Amir Arbabi, et al., "Dielectric metasurfaces for complete control of phase and polarization with subwavelength spatial resolution and high transmission", Nature Nanotechnology, vol. 10, pp. 937-943, Nov. 2015.
International Search Report PCT/ISA/210 for PCT/KR2017/000339 dated Jan. 10, 2017 issued Sep. 1, 2017.
International Search Report PCT/ISA/210 for PCT/KR2017/000339 dated Jan. 10, 2017 issueds Sep. 1, 2017.

* cited by examiner

PHYSICS MODULE OF CHIP-SCALE ATOMIC CLOCK

CROSS-REFERENCE TO RELATED APPLICATIONS

This application is a national phase under 35 U.S.C. § 371 of PCT International Application No. PCT/KR2017/000339 which has an International filing date of Jan. 10, 2017, which designated the Republic of Korea and which claims priority to Korean patent application number KR 10-2017-0000424 filed Jan. 2, 2017.

TECHNICAL FIELD

The present disclosure herein relates to an atomic clock, and particularly, to a physics module of a chip-scale atomic clock.

BACKGROUND ART

In general, an atomic clock is a device using energy levels of the ground state of alkali vapor as a frequency standard. The alkali vapor may absorb a portion of a laser beam having a resonant frequency. The portion of the laser beam may pass through the alkali vapor and constitutes a transmitted beam. The incident laser beam and the transmitted beam may have a plurality of side band spectra by current modulation of a laser diode. A frequency difference between the side bands may correspond to a resonant frequency corresponding to transition between energy levels of the alkali vapor. The resonant frequency may be in a microwave region. The microwave frequency may be read from the absorption spectrum of the beam transmitted through the alkali vapor. For example, when feedback is performed to match a frequency of a microwave oscillator with the resonant frequency of the alkali vapor, the microwave oscillator may be defined as an atomic clock.

The alkali vapor may be defined as a vapor cell. The vapor cell may store the alkali vapor in a closed cavity which is evacuated or in which a buffer gas is filled. The closed cavity may be a factor causing a volume and consumed power of the atomic clock to increase. The vapor cell is miniaturized to have a height of about 1 mm through a MEMS process and is sealed by bonding glass substrates to both surfaces of the silicon side wall part. A physics module of a general chip-scale atomic clock including the miniaturized vapor cell is described below. For example, the physics module of the general chip-scale atomic clock may include a laser source, a quarter wave plate, a vapor cell, and a detector. The quarter wave plate may circularly polarize a linearly polarized laser beam. The vapor cell may be disposed on the quarter wave plate. The circularly polarized laser beam may be provided to the vapor cell. The vapor cell may provide a spectrum signal for microwave interrogation by using the circularly polarized laser beam as a pump beam. An intensity of the transmitted pump beam may be measured by the detector. The detector may be disposed on the vapor cell. For example, the detector may determine whether a frequency difference between side bands of the transmitted beam is matched with a natural frequency of an atom by using spectroscopy of coherent population trapping (CPT).

In case of not the chip-scale atomic clock, the spectroscopy of the coherent population trapping (CPT) may be configured for signal improvement as described below. The improved physics module may include a laser source, a vapor cell, a polarization beam splitter, and a detector. The vapor cell may be disposed on the laser source. The linearly polarized laser beam may be provided to the vapor cell. The vapor cell may change the direction of linear polarization of the transmitted beam. The polarization beam splitter may be disposed on the vapor cell. The polarization beam splitter may split the transmitted beam depending on polarization directions. The transmitted beam may be split in a horizontal polarization direction and a vertical polarization direction. The detector may be disposed on the polarization beam splitter. The transmitted beam may be provided as a detected beam. The detector may measure an intensity of each of transmitted beams traveling in different directions according to the polarization directions. Detected signals of a horizontally polarized beam and a vertically polarized beam may be compared with each other by a differential amplification method. The atomic clock may have stability that is enhanced by the differential signal.

However, the quarter wave plate and/or the polarization beam splitter increase the volume and consumed power of the physics module of the general chip-scale atomic clock. For example, the polarization beam splitter has not been adopted to the chip-scale atomic clock due to a required space and power thereof.

DISCLOSURE OF THE INVENTION

Technical Problem

The present disclosure provides a physics module of a chip-scale atomic clock, which is capable of reducing volume and power consumption or improving performance.

Technical Solution

An embodiment of the inventive concept provides a physics module of a chip-scale atomic clock. The physics module includes: a housing; a laser source disposed in the housing and generating a laser beam; a vapor cell disposed above the laser source to generate a transmitted beam from the laser beam; and a detector disposed above the vapor cell to detect the transmitted beam. Here, the vapor cell includes a plurality of optical patterns configured to polarize the laser beam.

In an embodiment, the vapor cell may include: a transparent box; and an alkali gas filled in the transparent box. The optical patterns may be arranged on an outer wall of the transparent box or in the transparent box.

In an embodiment, the transparent box may include: a lower substrate; an upper substrate disposed above the lower substrate; and a side wall part configured to seal the alkali gas between the upper substrate and the lower substrate. The optical patterns may be made of a material different from that of each of the lower substrate and the upper substrate.

In an embodiment, each of the lower substrate and the upper substrate may include glass, and each of the optical patterns may include silicon, a silicon nitride, or a titanium oxide.

In an embodiment, the optical patterns may include striped patterns disposed on the lower substrate.

In an embodiment, each of the striped patterns may have a width of 120 nm, and the striped patterns may be spaced by 80 nm from each other.

In an embodiment, each of the striped patterns may have a thickness of 180 nm.

In an embodiment, the optical patterns may include: lower patterns disposed below the lower substrate; and upper patterns disposed on the upper substrate.

In an embodiment, the lower patterns may include striped patterns.

In an embodiment, the upper patterns may include elliptical patterns.

In an embodiment, the elliptical patterns may include elliptical cylinder pattern and circular cylinder pattern.

In an embodiment, the elliptical cylinder pattern may include: elliptical cylinder pattern having a major axis in a first direction; and elliptical cylinder pattern having a major axis in a second direction crossing the first direction.

In an embodiment, the elliptical cylinder pattern having the major axis in the first direction and the elliptical cylinder pattern having the major axis in the second direction may be disposed adjacent to each other, and the elliptical cylinder pattern having the major axis in the first direction and the elliptical cylinder pattern having the major axis in the second direction may be alternately disposed in first direction.

In an embodiment, each of the elliptical cylinder pattern may have a minor axis of 150 nm and a major axis of 270 nm.

In an embodiment, each of the upper patterns may have a thickness of 715 nm.

Advantageous Effects

As described above, the physics module of the chip-scale atomic clock according to the embodiment of the inventive concept may include the plurality of optical patterns disposed on each of the inner and outer walls of the vapor cell. The optical patterns may be disposed on and/or below the vapor cell. The optical patterns may have a thickness less than that of a typical quarter wave plate and/or a typical polarization beam splitter. As the entire volume of the physics module increases, more power is consumed by a heater to maintain a predetermined temperature. Thus, the optical patterns may reduce the volume and power consumption of the physics module.

BEST MODE FOR CARRYING OUT THE INVENTION

Hereinafter, preferred embodiments of the inventive concept will be described below in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. In addition, in the specification, it will be understood that when a layer (or film) is referred to as being 'on' another layer or substrate, it can be directly on the other layer or substrate, or intervening layers may also be present.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Figure 1:
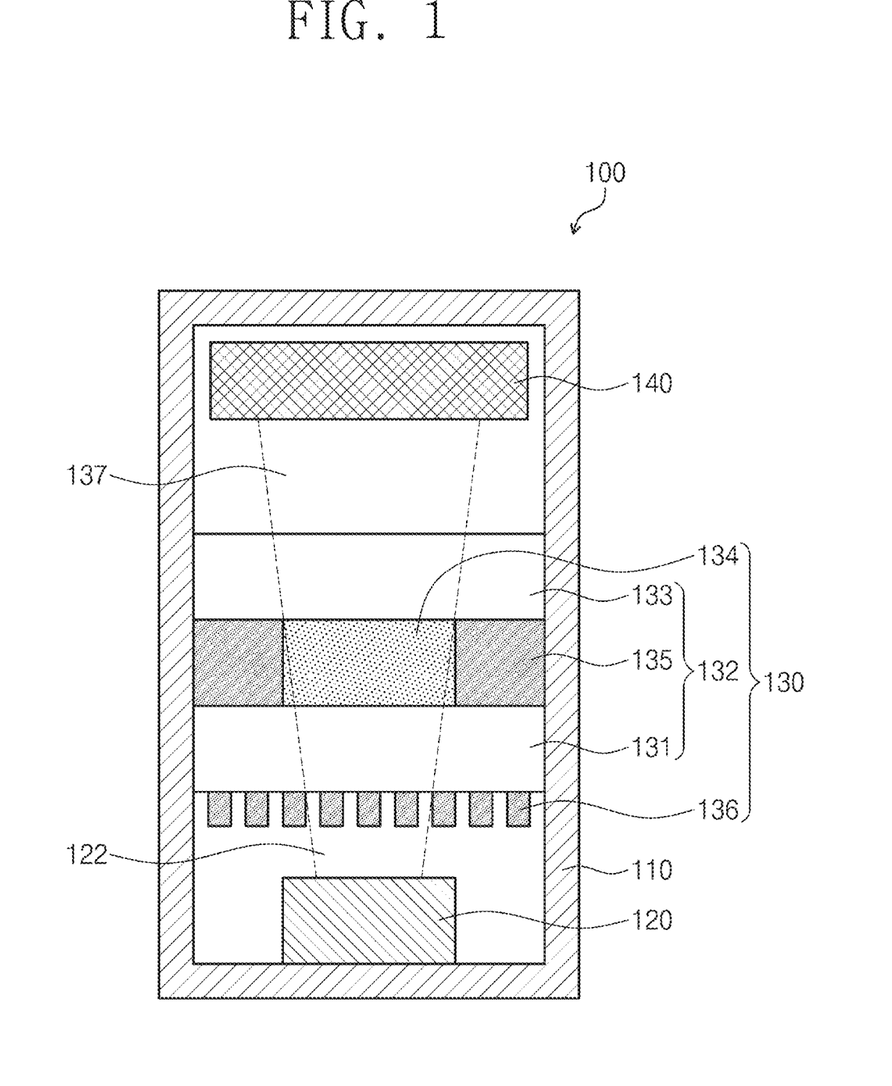
FIG. 1 is a cross-sectional view illustrating a physics module of a chip-scale atomic clock according to an embodiment of the inventive concept.

FIG. 1 is a cross-sectional view illustrating a physics module 100 of a chip-scale atomic clock according to an embodiment of the inventive concept.

Referring to FIG. 1, the physics module 100 of the chip-scale atomic clock according to an embodiment of the inventive concept may include a package housing 110, a laser source 120, a vapor cell 130, and a detector 140.

The package housing 110 may surround the laser source 120, the vapor cell 130, and the detector 140. The package housing 110 may protect the laser source 120, the vapor cell 130, and the detector 140 from an external environment.

The laser source 120 may be disposed on a bottom portion in the package housing 110. The laser source 120 may provide a laser beam 122 to the vapor cell 130. For example, the laser source 120 may include a vertical-cavity surface-emitting laser (VCSEL). The laser beam 122 may have a wavelength of about 895 nm.

The vapor cell 130 may be disposed on the laser source 120. The vapor cell 130 may receive the laser beam 122 and provide a transmitted beam 137 to the detector 140. According to an embodiment, the vapor cell 130 may include a transparent box 132, alkali vapor 134, and optical patterns 136.

The transparent box 132 may transmit the laser beam 122 to the alkali vapor 134. The transparent box 132 may transmit the transmitted light 137, which is transmitted through the alkali vapor 134. The transparent box 132 may store the alkali vapor 134. According to an embodiment, the transparent box 132 may include a lower substrate 131, an upper substrate 133, and a side wall part 135.

The lower substrate 131 may be a transparent substrate. For example, the lower substrate 131 may contain glass and/or silicon. The upper substrate 133 may be disposed on the lower substrate 131. The upper substrate 133 may be a transparent substrate like the lower substrate 131. For example, the upper substrate 133 may contain glass and/or silicon. The side wall part 135 may be disposed between the lower substrate 131 and the upper substrate 133. The side wall part 135 may seal the alkali vapor 134 between the lower substrate 131 and the upper substrate 133. For example, the side wall part 135 may contain glass and/or silicon.

The alkali vapor 134 may be filled in the transparent box 132. The alkali vapor 134 may absorb a portion of the laser beam 122. A portion of the laser beam 122 may be transmitted through the alkali vapor 134 and produced as the transmitted beam 137. Each of the laser beam 122 and the transmitted beam 137 may have a plurality of side-band spectrums. A frequency difference between the side-bands may correspond to a wavelength of a microwave region. The alkali vapor 134 may contain cesium (Cs) or rubidium (Rb). Although not shown, the alkali vapor 134 may be mixed with a buffer gas. The buffer gas may prevent coherence of the ground state of the alkali vapor from being destroyed by collision with the inner wall and the side wall part. For example, the buffer gas may include neon (Ne), argon (Ar), and nitrogen ($N_2$).

The optical patterns 136 may be disposed on an outer wall of the transparent box 132. Alternately, the optical patterns 136 may be disposed in the transparent box 132. According to an embodiment, the optical patterns may be disposed on and/or below the lower substrate 131. The optical patterns 136 may polarize the laser beam 122. For example, the optical patterns 136 may circularly polarize the laser beam 122. According to an embodiment, the optical patterns 135 may be made of a material having a refractive index greater than that of each of the upper and lower substrates. The optical patterns 136 may contain silicon, silicon nitride, or titanium oxide. Each of the optical patterns 136 may have a thickness less than that of a typical quarter wave plate. Each of the optical patterns may have a thickness of about 180 nm. The optical patterns 136 may reduce a volume of the physics module 100 of the chip-scale atomic clock.

Figure 2:
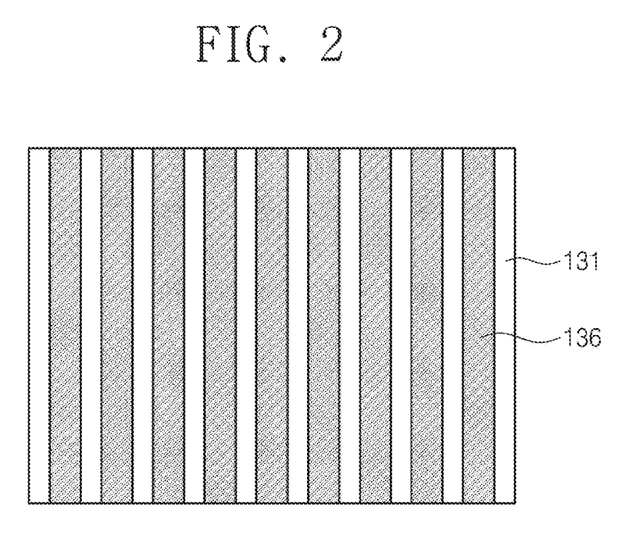
FIG. 2 is a plane view illustrating optical patterns and a lower substrate in FIG. 1.

FIG. 2 is a view illustrating the optical patterns 136 and the lower substrate 131 in FIG. 1.

Referring to FIGS. 1 and 2, the optical patterns 136 may include striped patterns. Each of the striped patterns may act as an optical resonator. Alternatively, the optical patterns 136 may include an elliptical pattern. The optical patterns 136 may polarize the laser beam 122. According to an embodiment, the laser beam 122 may be circularly polarized by resonant structures. For example, the laser beam 122 transmitted to the optical patterns 136 may have a phase that is delayed depending on the polarization direction thereof. The optical patterns 136 may be designed to generate about 90° of phase retardation with respect to polarization directions perpendicular to each other. Each of the optical patterns 136 may have a width of about 180 nm and a gap of about 120 nm. The optical patterns 136 may decrease a power consumption of the physics module 100 of the chip-scale atomic clock.

Figure 3:
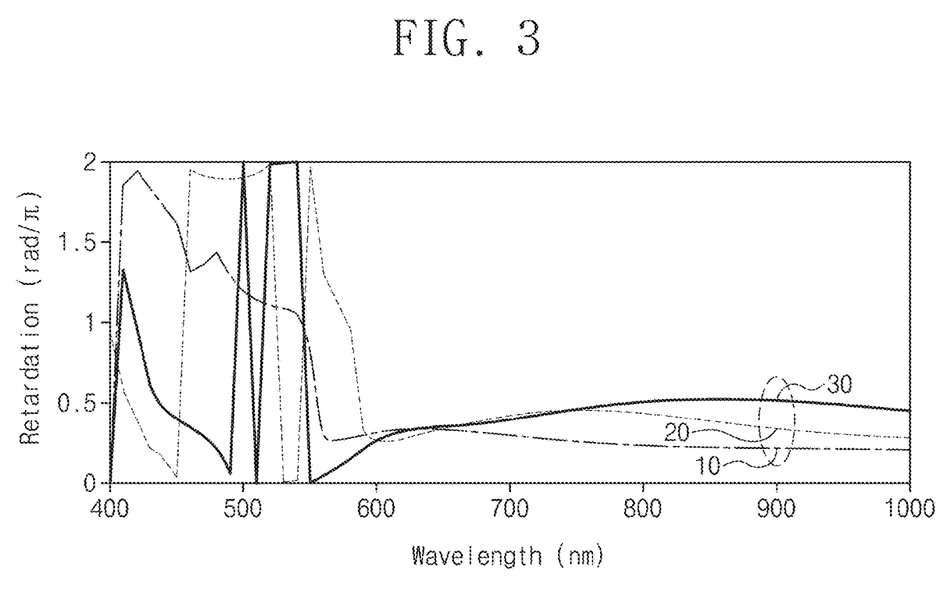
FIG. 3 is graphs showing phase retardation between polarized beams, which are perpendicular to each other, as a function of a wavelength of a laser beam transmitted through optical patterns in FIG. 2.

FIG. 3 is a graph showing phase retardation between polarized beams, which are perpendicular to each other, as a function of wavelength of the laser beam 122 transmitted through the optical patterns 136 in FIG. 2.

Referring to FIG. 3, the phase retardation between polarized beams, which are perpendicular to each other, may be varied depending on the width of each of the optical patterns 136. For example, in a case 10 when each of the optical patterns 136 has a width of about 100 nm, the optical patterns 136 may retard a phase between polarized beams, which are perpendicular to each other, of the laser beam 122 by about $0.2\pi$ at the wavelength of about 895 nm. In a case 20 when each of the optical patterns 136 has a width of about 140 nm, the optical patterns 136 may retard the phase between the polarized beams, which are perpendicular to each other, of the laser beam 122 by about 0.3n at the wavelength of about 895 nm. In a case 30 when each of the optical patterns 136 has a width of about 180 nm, the optical patterns 136 may retard the phase between the polarized beams, which are perpendicular to each other, of the laser beam 122 by about 0.5n at the wavelength of about 895 nm. That is, the optical patterns 136 each having a width of about 180 nm may retard the phase difference between the polarized beams, which are perpendicular to each other, of the laser beam 122 by a quarter of a wavelength at the wavelength of about 895 nm. The laser beam 122 may be circularly polarized. The circularly polarized laser beam 122 may efficiently pump the alkali vapor 134 without variation of the polarization of the beam.

Referring to FIG. 1 again, the detector 140 may detect the circularly polarized transmitted beam 137. For example, the detector 140 may include a photo-diode. Alternatively, the detector 140 may include a charge coupled device (CCD) or a CMOS sensor.

MODE FOR CARRYING OUT THE INVENTION

Figure 4:
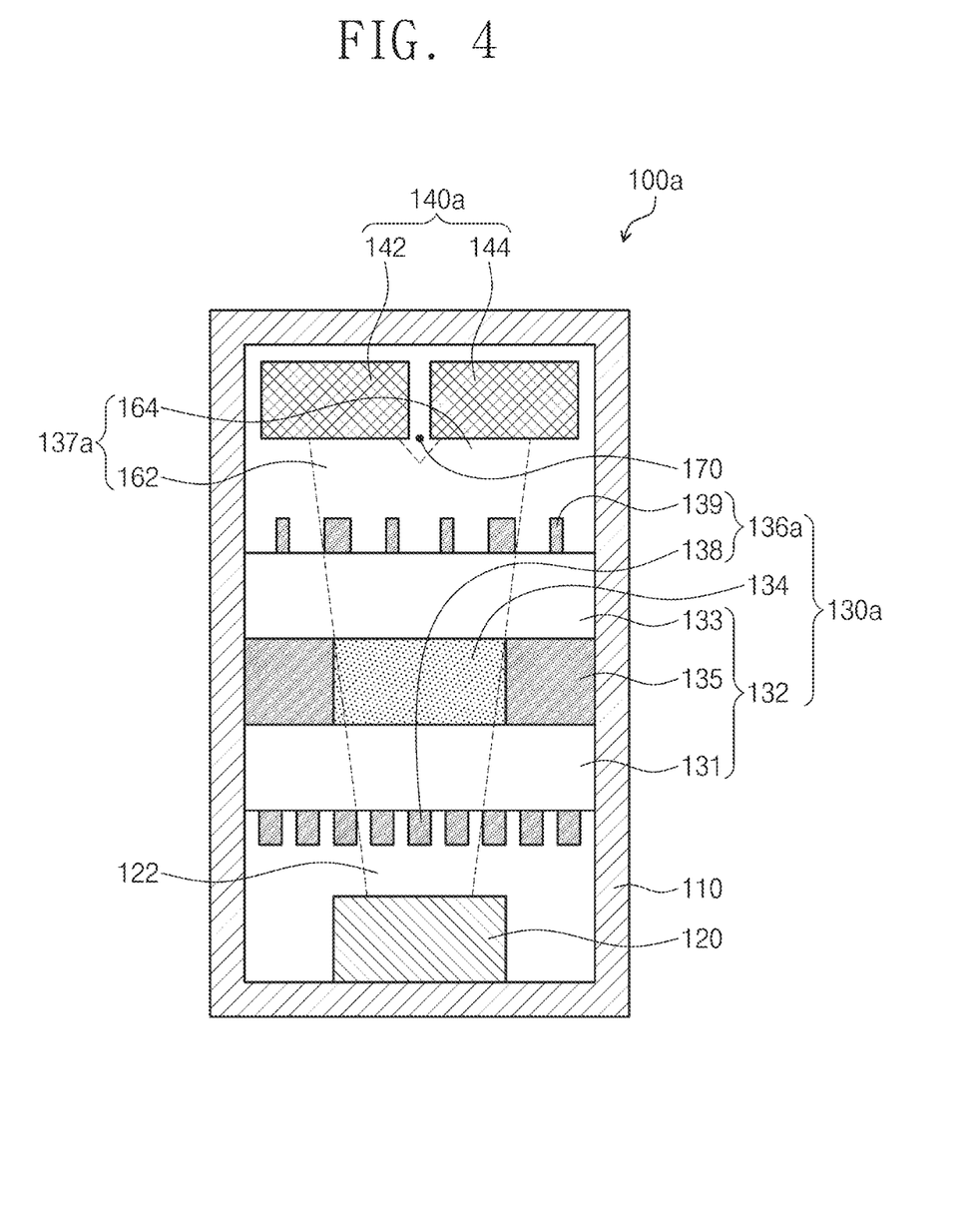
FIG. 4 is a cross-sectional view illustrating a physics module of a chip-scale atomic clock according to an embodiment of the inventive concept.

FIG. 4 is a cross-sectional view illustrating a physics module 100a of a chip-scale atomic clock according to an embodiment of the inventive concept.

Referring to FIG. 4, the physics module 100a of the chip-scale atomic clock may include optical patterns 136a of lower and upper patterns 138 and 139 and a plurality of detectors 140a. A package housing 110 and a laser source 120 may be provided in the same manner as in FIG. 1.

The optical patterns 136a may be disposed on each of upper and lower portions of a transparent box 132. The optical patterns 136a may contain silicon, a silicon nitride, or a titanium oxide. According to an embodiment, the optical patterns 136a may include lower patterns 138 and upper patterns 139.

The lower patterns 138 may be disposed below a lower substrate 131 of the transparent box 132. The lower patterns 138 may be striped patterns in FIG. 2. Alternatively, the lower patterns 138 may be elliptical patterns. The lower patterns 138 may circularly polarize a laser beam 122. A polarization direction of the laser beam 122 may be a 45° direction having vertical and horizontal elements in the same manner. The polarized laser beam 122 may be provided to alkali vapor 134. The alkali vapor 134 may generate a transmitted beam 137a having a changed polarization direction.

The upper patterns 139 may be disposed on an upper substrate 133 of the transparent box 132. The upper patterns 139 may change a path of the transmitted beam 137a. According to an embodiment, the upper patterns 139 may include a polarization beam splitter. The upper patterns 139 may split the transmitted beam 137a on the basis of the polarization direction.

Figure 5:
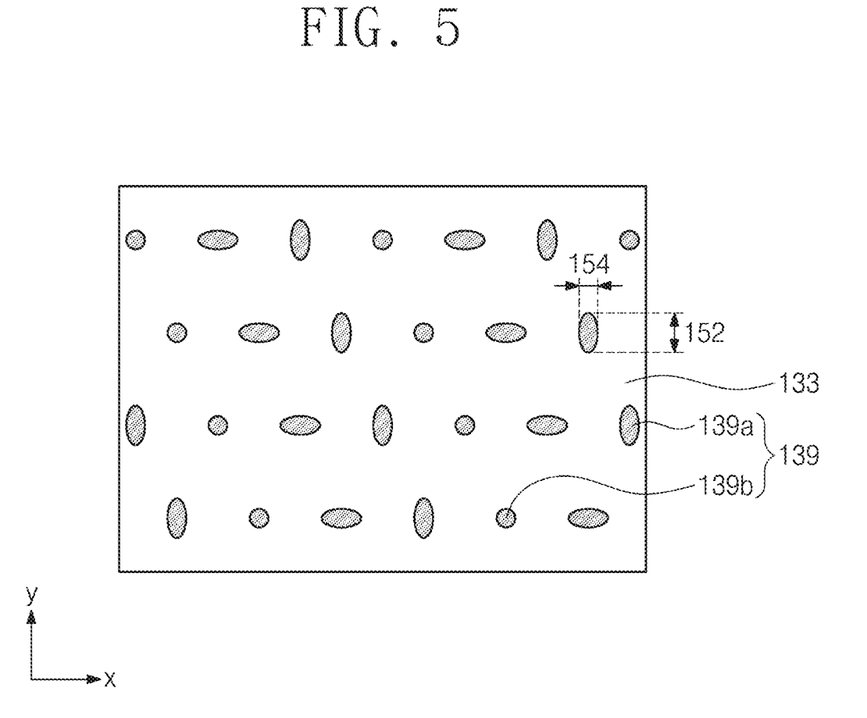
FIG. 5 is a plane view illustrating upper patterns and an upper substrate in FIG. 4.

FIG. 5 is a plane view illustrating the upper patterns 139 and the upper substrate 133 in FIG. 4.

Referring to FIGS. 4 and 5, the upper patterns 139 may include elliptical patterns. Alternatively, the upper patterns 139 may include stripe and/or linear patterns. According to an embodiment, the upper patterns 139 may include elliptic cylinder patterns 139a and circular cylinder patterns 139b. The elliptic cylinder patterns 139a may have a major axis 152 and a minor axis 154 on a plane. For example, the major axis 152 may have a length of about 270 nm. The minor axis 154 may have a length of about 150 nm. The elliptical cylinder patterns 139a may include elliptical cylinder patterns having the major axis 152 in a y-direction and elliptical cylinder patterns having the major axis 152 in an x-direction. The elliptical cylinder patterns having the major axis 152 in the y-direction and the elliptical cylinder patterns having the major axis 152 in the x-direction may be disposed adjacent to each other with respect to the x-direction.

The elliptical cylinder patterns 139a and the circular cylinder patterns 139b may be alternately disposed in the x-direction. A distance between the elliptical cylinder patterns having the major axis 152 in the y-direction and the circular cylinder patterns 139b may be the same as that between the elliptical cylinder patterns having the major axis 152 in the x-direction and the circular cylinder patterns 139b. Each of the circular cylinder patterns 139b may have a diameter of about 200 nm on the plane.

Referring to FIG. 4, the emitted beam 137a may include a horizontally polarized beam 162 and a vertically polarized beam 164. The horizontally polarized beam 162 and the vertically polarized beam 164 may travel in different directions from each other between the vapor cell 130a and the detectors 140.

Figure 6:
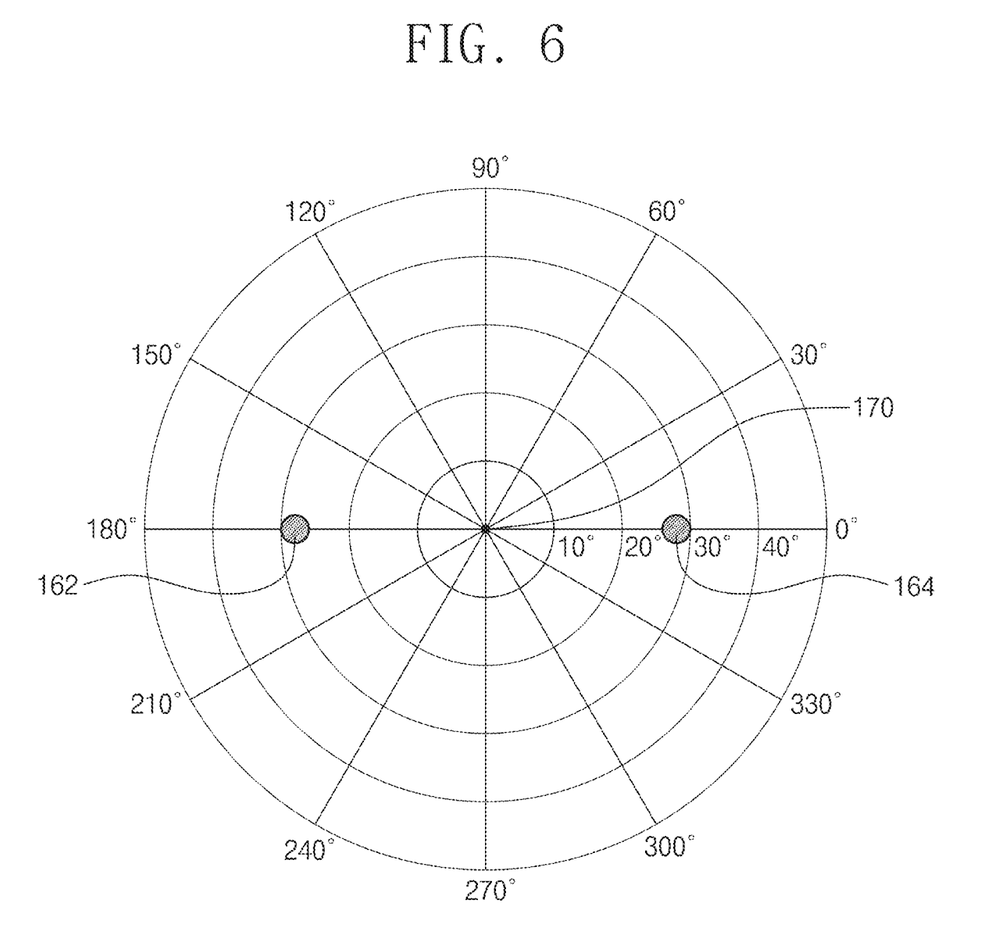
FIG. 6 is a plane view illustrating a traveling direction of an emitted beam after the polarization beam splitter in FIG. 4.

FIG. 6 is a plane view illustrating a traveling direction of the emitted beam 137a in FIG. 4 according to a polarization direction thereof.

Referring to FIG. 6, the horizontally polarized beam 162 and the vertically polarized beam 164 may travel to positions deviated from a center of the vapor cell 130a and/or a center 170 of the detectors 140. According to an embodiment, the horizontally polarized beam 162 and the vertically polarized beam 164 may be provided to positions, which are opposite to each other, with respect to the center 170 of the detectors 140.

The horizontally polarized beam 162 may have an azimuth of about 180° and a polar angle of about 30° with respect to the center 170 of the detectors 140. The vertically polarized beam 164 may have an azimuth of about 0° and a polar angle of about 30° with respect to the center 170 of the detectors 140. Thus, the upper patterns 139 may replace a typical polarization beam splitter.

Referring to FIG. 4 again, each of the upper patterns 139 may have a thickness of about 715 nm. The lower patterns 138 and the upper patterns 139 may reduce the volume of the physics module 100 of the chip-scale atomic clock. The lower patterns 138 and the upper patterns 139 may decrease the power consumption of the physics module 100 of the chip-scale atomic clock in comparison with a typical method.

Referring to FIGS. 4 and 6, the detectors 140a may detect the split emitted beam 137a. According to an embodiment, the detectors 140a may include a first detector 142 and a second detector 144. The first detector 142 and the second detector 144 may face each other with respect to the center 170. The first detector 142 may detect the horizontally polarized beam 162. The second detector 144 may detect the vertically polarized beam 164. A control unit may differentially amplify detection signals of the horizontally polarized beam 162 and the vertically polarized beam 164 and acquire a signal of coherent population trapping.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

The invention claimed is:

1. A physics module of a chip-scale atomic clock, comprising:
    a housing;
    a laser source in the housing and configured to generate a laser beam;
    a vapor cell above the laser source and configured to generate a transmitted beam from the laser beam; and
    a detector above the vapor cell configured to detect the transmitted beam,
    wherein the vapor cell comprises
        a transparent box;
        an alkali gas filled in the transparent box; and
        a plurality of optical patterns configured to polarize the laser beam and the transmitted beam, and
    wherein the plurality of optical patterns comprises
        lower patterns below the transparent box; and
        upper patterns on the transparent box.

2. The physics module of claim 1,
    wherein the optical patterns are arranged on an outer wall of the transparent box or in the transparent box.

3. The physics module of claim 1, wherein the transparent box comprises:
    a lower substrate;
    an upper substrate on the lower substrate; and
    a side wall part configured to seal the alkali gas between the upper substrate and the lower substrate, and
    wherein the optical patterns are made of a material different from that of each of the lower substrate and the upper substrate.

4. The physics module of claim 3, wherein each of the lower substrate and the upper substrate comprises glass, and
    wherein each of the optical patterns comprises silicon, a silicon nitride, or a titanium oxide.

5. The physics module of claim 3, wherein the plurality of optical patterns comprise striped patterns on the lower substrate.

6. The physics module of claim 5, wherein each of the striped patterns has a width of 120 nm, and the striped patterns are spaced by 80 nm from each other.

7. The physics module of claim 5, wherein each of the striped patterns has a thickness of 180 nm.

8. The physics module of claim 1, wherein the lower patterns comprise striped patterns.

9. The physics module of claim 1, wherein the upper patterns comprise elliptical patterns.

10. The physics module of claim 9, wherein the elliptical patterns comprise elliptical cylinder pattern and circular cylinder pattern.

11. The physics module of claim 10, wherein the elliptical cylinder pattern comprise:
    elliptical cylinder pattern having a major axis in a first direction; and
    elliptical cylinder pattern having a major axis in a second direction crossing the first direction.

12. The physics module of claim 11, wherein the elliptical cylinder pattern having the major axis in the first direction and the elliptical cylinder pattern having the major axis in the second direction are adjacent to each other, and the elliptical cylinder pattern having the major axis in the first direction and the elliptical cylinder pattern having the major axis in the second direction are alternately in the first direction.

13. The physics module of claim 10, wherein each of the elliptical cylinder patterns has a minor axis of 150 nm and a major axis of 270 nm.

14. The physics module of claim 1, wherein each of the upper patterns has a thickness of 715 nm.

\* \* \* \* \*